US007433204B2

(12) United States Patent
Araishi

(10) Patent No.: US 7,433,204 B2
(45) Date of Patent: Oct. 7, 2008

(54) STRUCTURE FOR ATTACHING ELECTRONIC COMPONENT TO ATTACHMENT PORTION AND IMAGE FORMING APPARATUS HAVING SUCH STRUCTURE

(75) Inventor: Kuniaki Araishi, Osaka (JP)

(73) Assignee: Kyocera Mita Corporation (JP)

( * ) Notice: Subject to any disclaimer, the term of this patent is extended or adjusted under 35 U.S.C. 154(b) by 0 days.

(21) Appl. No.: 11/801,707

(22) Filed: May 10, 2007

(65) Prior Publication Data

US 2007/0264877 A1 Nov. 15, 2007

(30) Foreign Application Priority Data

May 12, 2006 (JP) ............................. 2006-133853

(51) Int. Cl.
*H05K 7/14* (2006.01)
*H05K 7/18* (2006.01)

(52) U.S. Cl. ....................................... 361/801; 361/740

(58) Field of Classification Search ................. 361/801, 361/802, 759, 740, 732, 726, 747; 174/520, 174/535, 541; 439/387, 391, 488, 489, 296
See application file for complete search history.

(56) References Cited

U.S. PATENT DOCUMENTS 5,944,210 A * 8/1999 Yetter ........................ 220/4.21
6,206,087 B1 * 3/2001 Nakase et al. .............. 165/80.3
6,373,694 B1 * 4/2002 Chang ......................... 361/685
6,816,370 B2 * 11/2004 Searby et al. ............... 361/685
7,310,235 B2 * 12/2007 Chen et al. .................. 361/752

FOREIGN PATENT DOCUMENTS

JP 9-319206 12/1997

* cited by examiner

*Primary Examiner*—Hung S Bui
(74) *Attorney, Agent, or Firm*—Gerald E. Hespos; Anthony J. Casella

(57) ABSTRACT

A structure is provided to reduce cost for attaching an electronic component and to prevent disengagement of the component. This structure has first locking pieces opposed to each other in a first direction. Second locking pieces are distanced from the first locking pieces in a direction normal to the first direction and project from the component. The attachment portion has first and second locking holes for locking the first and second locking pieces. The first locking hole includes an insertion portion to permit insertion of both first locking pieces, and locks for receiving the first locking pieces from the insertion portion in the second direction. The locks hinder removal of the first locking pieces. The second locking piece contacts an edge of the second locking hole to hinder both first locking pieces from moving into the insertion portion from the locking portions of the first locking hole.

12 Claims, 11 Drawing Sheets

STRUCTURE FOR ATTACHING ELECTRONIC COMPONENT TO ATTACHMENT PORTION AND IMAGE FORMING APPARATUS HAVING SUCH STRUCTURE

BACKGROUND OF THE INVENTION

1. Field of the Invention

The present invention relates to a structure for attaching electronic components such as photointerrupters to attachment portions provided in various devices, and an image forming apparatus having such a structure.

2. Description of the Related Art

Various electronic components such as a photosensor for detecting a sheet passing a sheet conveyance path, a toner sensor for detecting the density and remaining amount of a developing agent, and an interlock switch for detecting the opening and closing of a manual insertion tray disposed at a side surface of an apparatus main body are mounted in an image forming apparatus such as a copier, a facsimile machine or a printer.

Generally, structures including screws are used to attach such electronic components in the apparatus main body of the above image forming apparatus. Specifically, screw holes are formed at specified positions of an attachment portion disposed in the apparatus main body, and through holes for the passage of the screws are formed in the electronic component. The screws fix the electronic component to the attachment portion by being screwed into the screw holes through the through holes.

However, such structures require many parts and many operation steps for the attachment of the electronic components, which leads to an increase in the production cost of the image forming apparatus.

An electronic component attaching structure designed to reduce the numbers of parts and operation steps is disclosed in Japanese Unexamined Patent Publication No. H09-319206. This structure includes an electronic component having a component-side locking claw and an attachment portion, to which this electronic component is attachable and which is formed with an apparatus-side locking claw or locking hole engageable with the component-side locking claw. The electronic component is fixed to the attachment portion by the engagement of the component-side locking claw and the apparatus-side locking claw or locking hole.

This structure is shown in detail in FIGS. 10 and 11. FIG. 10 shows an electronic component 100. This electronic component 100 includes a casing having the lower surface, and locking pieces 101 are integrally formed with the casing at the opposite ends of the lower surface with respect to longitudinal direction. These locking pieces 101 extend downward from the lower surface, and a locking claw 102 projects outward along the longitudinal direction of the casing from the leading end of each locking piece 101. On the other hand, FIG. 11 shows an attachment portion 110 to which the electronic component 100 is attached. This attachment portion 110 is in the form of a plate, and a rectangular locking hole 111 is formed to penetrate the attachment portion 110 in thickness direction. A dimension of the longer sides of this locking hole 111 is substantially equal to the longitudinal dimension of the electronic component 100, and a dimension of the shorter sides thereof is substantially equal to the width of the respective locking pieces 101 of the electronic component 100.

Both locking pieces 101 of the electronic component 100 are inserted into the locking hole 111. At an initial stage of the insertion, the locking claws 102 of the respective locking pieces 101 are pressed inward along the longitudinal direction of the locking hole 111 by the peripheral edges of the locking hole 111 of the attachment portion 110, and the respective locking pieces 101 are elastically deformed in the pressed directions. Upon completely passing the locking hole 111, the both locking claws 102 are restored to their initial positions by their elastic restoring forces. The respective locking claws 102 returned to the initial positions are engaged with the peripheral edges of the locking hole 111 of the attachment portion 110 as shown in FIG. 11, thereby preventing the electronic component 100 from being disengaged from the attachment portion 110.

This attaching structure can reduce the number of parts and operation steps since requiring no screws, whereby the production cost can be reduced.

However, in this structure, it is difficult to ensure sufficient rigidity for the respective locking pieces 101. Particularly in recent years, there has been a demand to reduce the costs of electronic components themselves to be mounted in image forming apparatuses, wherefore it is difficult to shape locking pieces integrally formed on casings of the electronic components in such a manner as to provide high rigidity, i.e. to be unlikely to deform.

This insufficient rigidity of the locking pieces 101 reduces reliability in fixing the electronic components. For example, if a pulling force acts on a wire connected with the electronic component 100 to exert a force of this direction to the electronic component 100 in the structure shown in FIG. 11, the both locking pieces 101 yield to this force to be deformed inward, whereby the both locking claws 102 are disengaged from the attachment portion 110, making it likely for the electronic component 100 to come off the attachment portion 110.

SUMMARY OF THE INVENTION

In view of the above situation, an object of the present invention is to provide an electronic component attaching structure capable of reducing the number of parts and simplifying an attaching operation for the attachment of an electronic component to reduce a production cost and reliably preventing the attached electronic component from coming off, and an image forming apparatus having such a structure.

This structure comprises an electronic component and an attachment portion to which the electronic component is attached. The electronic component has a rear surface and the attachment portion has an attachment surface facing the rear surface.

The electronic component includes a pair of first locking pieces projecting from the rear surface and opposed to each other in a first direction parallel to the attachment surface, and a second locking piece projecting from the rear surface at a position distanced from the first locking pieces in a second direction parallel to the attachment surface and normal to the first direction.

The attachment portion is formed with a first locking hole which is a through hole and into which the both first locking pieces are insertable in a projecting direction thereof, and a second locking hole which is a through hole and into which the second locking piece is insertable in a projecting direction thereof, wherein the first locking hole includes an insertion portion for insertion of the both first locking pieces and locking portions neighboring the insertion portion at a side opposite to the second locking hole. The insertion portion is so shaped as to permit the insertion of the both first locking pieces thereinto, and the locking portions are so shaped that the first locking pieces can move into the locking portions from the insertion portion while being inserted in the insertion portion and the both first locking pieces are prevented from coming out of the locking portions.

The second locking piece is so shaped as to be engaged with the attachment portion by being inserted into the second locking hole while the both first locking pieces being located in the locking portions of the first locking hole and is, in this state, in contact with a peripheral edge of the second locking hole to hinder the first locking pieces from moving from the locking portions of the first locking hole toward the insertion portion. This hindrance reliably prevents the disengagement of the electronic component from the attachment portion.

The present invention is also directed to an image forming apparatus comprising an electronic component attaching structure having the above construction.

DETAILED DESCRIPTION OF THE PREFERRED EMBODIMENTS

Hereinafter, preferred embodiments of the present invention are described with reference to the accompanying drawings.

Figure 1:
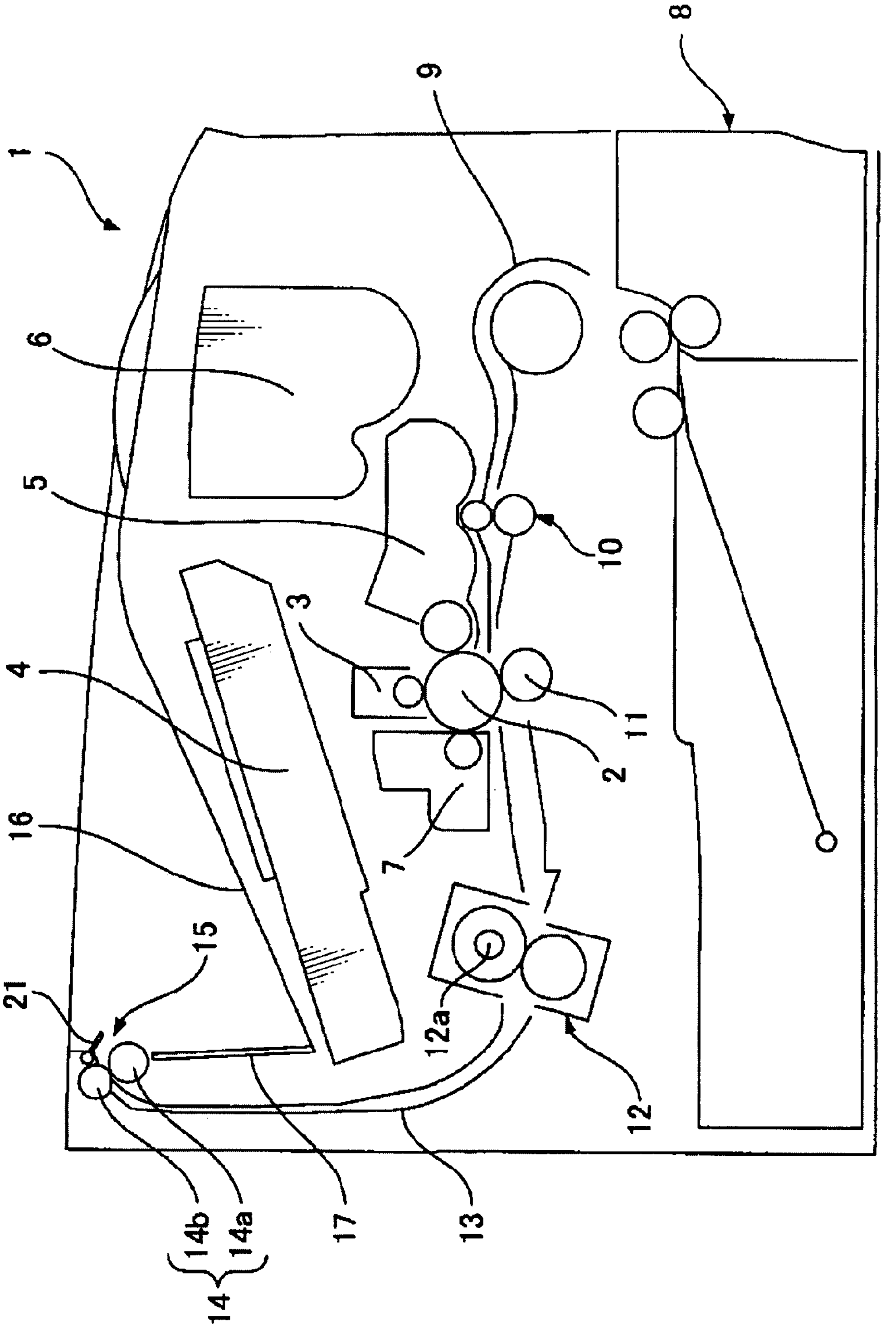
FIG. 1 is a diagram showing the entire construction of an image forming apparatus according to one embodiment of the invention.

FIG. 1 shows the entire construction of an image forming apparatus 1 according to the invention, wherein the front side of the image forming apparatus 1 is shown at the right side of FIG. 1. Although a printer is shown as an example of the image forming apparatus 1 in FIG. 1, the image forming apparatus 1 according to the present invention is not limited to the printer and may be, for example, a copier or a facsimile machine.

The image forming apparatus 1 includes a photoconductive drum 2, a charging unit 3, an exposure unit (e.g. laser scanner unit) 4, a developing unit 5, a toner container 6 and a cleaning device 7 as an image forming assembly for forming an image on a sheet. The photoconductive drum 2 is drivingly rotated in clockwise direction of FIG. 1 for image formation. The charging unit 3 uniformly charges the outer circumferential surface of the photoconductive drum 2. The exposure unit 4 irradiates the outer circumferential surface of the photoconductive drum 2 with a laser beam generated based on a document image data to form an electrostatic latent image. The document image data is transmitted from an unillustrated personal computer. The developing unit 5 forms a toner image by causing toner as a developing agent to adhere to the electrostatic latent image formed on the photoconductive drum 2. The toner container 6 supplies the toner to the developing unit 5.

An unillustrated charge removing device for removing residual charges on the outer circumferential surface of the photoconductive drum 2 and a transfer roller 11 as an image transferring portion are disposed downstream of the cleaning device 7 with respect to a rotating direction of the photoconductive drum 2. This transfer roller 11 transfers the toner image formed on the outer circumferential surface of the photoconductive drum 2 to the sheet. The sheet having this toner image transferred thereto is separated from the photoconductive drum 2.

On the other hand, this image forming apparatus 1 is provided with a mechanism for conveying a sheet toward the photoconductive drum 2 having a toner image formed thereon as described above. This mechanism includes a sheet cassette 8, a sheet supply path 9 and a pair of registration rollers 10. The sheet is stocked in the sheet cassette 8, and is conveyed from this sheet cassette 8 to the photoconductive drum 2 via the sheet supply path 9 and the pair of registration rollers 10.

A discharge port 15 for discharging the sheet is disposed at the top of this image forming apparatus 1, and a discharge tray 16 is arranged right below the discharge port 15. A fixing device 12, a sheet conveyance path 13 and a pair of discharge rollers 14 are arranged in this order from the transfer roller 11 between the discharge portion 15 and the transfer roller 11.

The fixing device 12 has a pair of fixing rollers 12*a*, fixes the toner image transferred to the sheet conveyed from the transfer roller 11, and conveys this sheet to the pair of discharge rollers 14 via the sheet conveyance path 13. The pair of discharge rollers 14 include a drive roller 14*a* drivingly rotated by unillustrated driving means and a driven roller 14*b* driven to rotate, following the rotation of the drive roller 14*a*, while being held in pressing contact with the drive roller 14*a*, and discharges the sheet conveyed from the fixing device 12 to the discharge tray 16 through the discharge port 15.

The discharge tray 16 has an inclined surface as shown in FIG. 1. This inclined surface is so inclined as to be at the lowest position right below the discharge port 15 and to be gradually elevated in a sheet discharging direction. The sheet discharged from the discharge port 15 slides down on the inclined surface by the action of its own weight. The trailing end of this sheet comes into contact with a rear wall 17 standing up from the rear end of the inclined surface of the discharge tray 16. Discharged sheets are successively stacked on the discharge tray 16 while having the trailing end positions thereof aligned by this contact.

Figure 2:
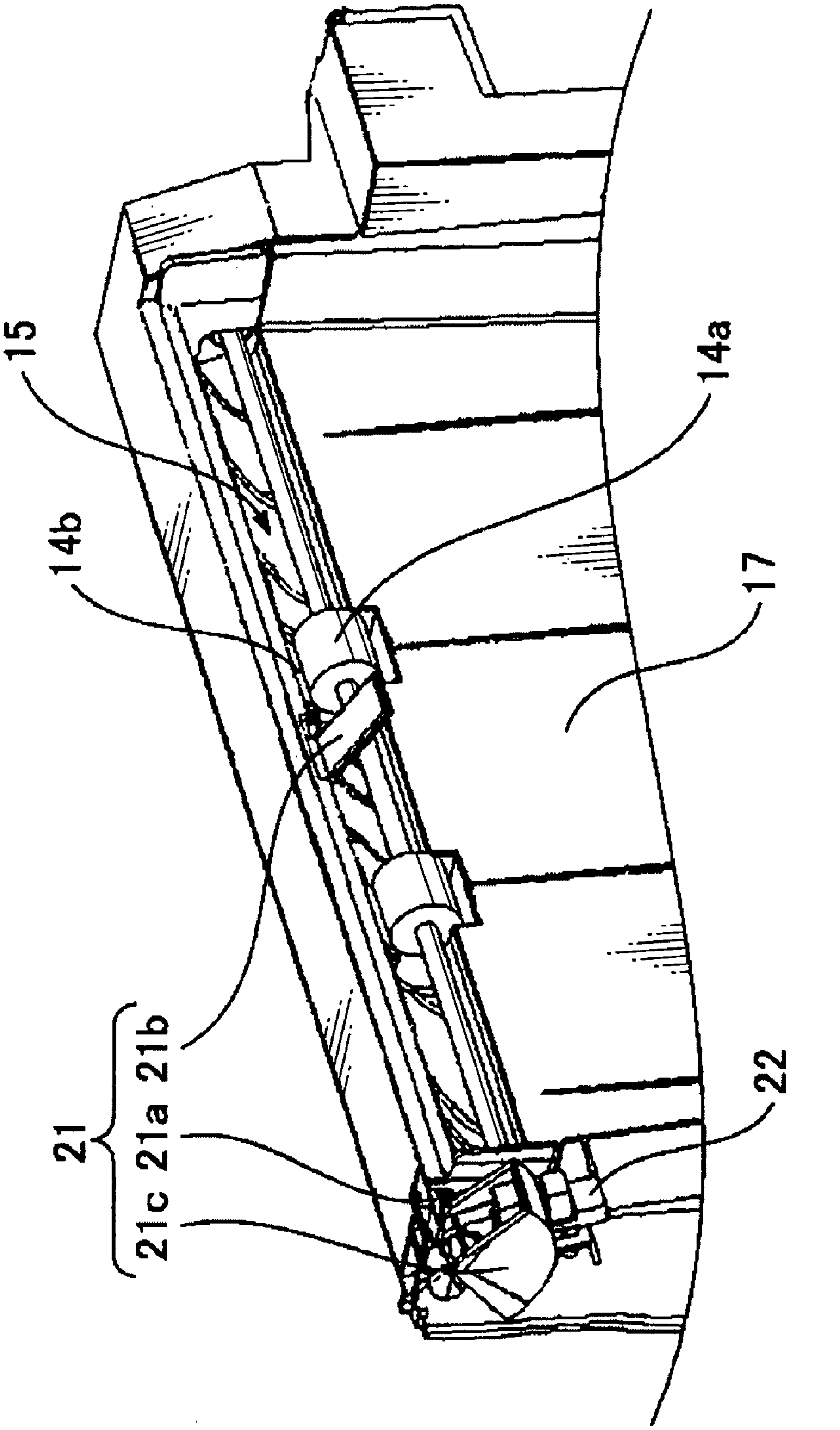
FIG. 2 is a perspective view showing a detector disposed at a discharge port of the image forming apparatus.
Figure 3:
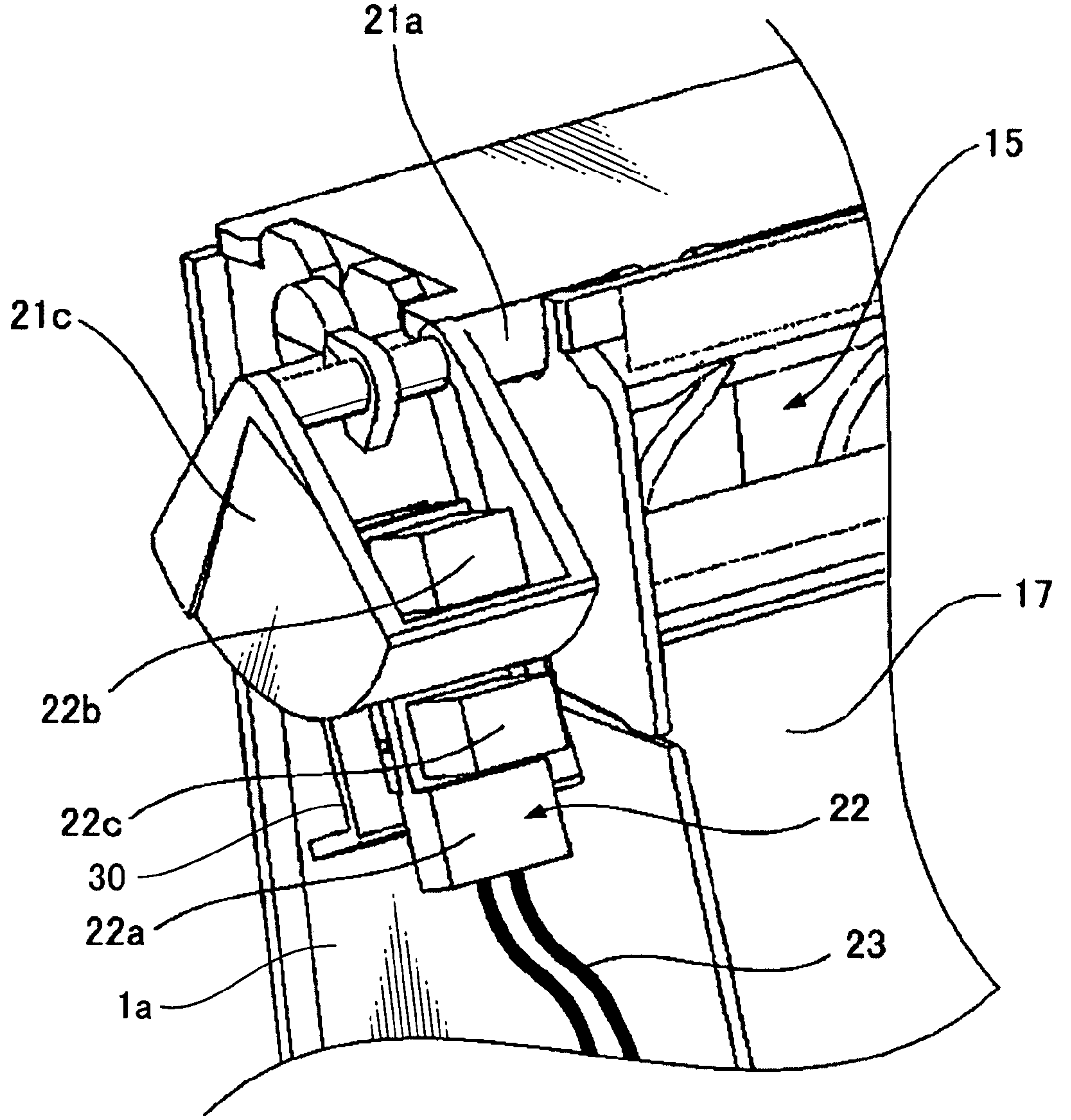
FIG. 3 is an enlarged perspective view showing a light blocking portion of an actuator and a photosensor constituting the detector shown in FIG. 2.

A detector for detecting the jam of a sheet being discharged and the overflow of sheets stacked on the discharge tray 16 is disposed above the discharge port 15. FIG. 2 shows a disposed state of the detector, and FIG. 3 is an enlarged view of the detector. FIGS. 2 and 3 show a state without an external cover mounted on the image forming apparatus in order to facilitate the description.

The detector is comprised of an actuator 21 and a photosensor 22 as shown in FIG. 2. The actuator 21 operates to turn the photosensor 22 on and off according to a discharged state of a sheet and includes a shaft 21*a*, a sheet detecting portion 21*b* and a light blocking portion 21*c*.

The shaft 21*a* extends in the width direction of the discharge port 15, is arranged above the discharge port 15 in such a posture parallel to a rotary shaft of the drive roller 14*a*, and is so mounted in the apparatus main body as to be rotatable about the central axis thereof. This shaft 21*a* has a length that is about half the entire width of the discharge port 15, and penetrates through a side wall 1*a* at a side of the discharge port 15.

The sheet detecting portion 21*b* is integrally formed on an end of the shaft 21*a* located in the discharge port 15, out of the opposite ends of the shaft 21*a*, and is so shaped as to interfere with a sheet discharged from the discharge port 15.

The light blocking portion 21*c* is formed at one of the opposite ends of the shaft 21*a* projecting outward from the side wall 1*a*, and rotates together with the shaft 21*a*. The photosensor 22 is arranged such that the rotation of the light blocking portion 21*c* turns the photosensor 22 on and off as described later. When no sheet is discharged, the actuator 21 is held in such a posture determined by the weights of the sheet detecting portion 21*b* and the light blocking portion 21*c*. In this posture, the sheet detecting portion 21*b* projects obliquely downward into a sheet discharge path in the sheet discharging direction.

Figure 4:
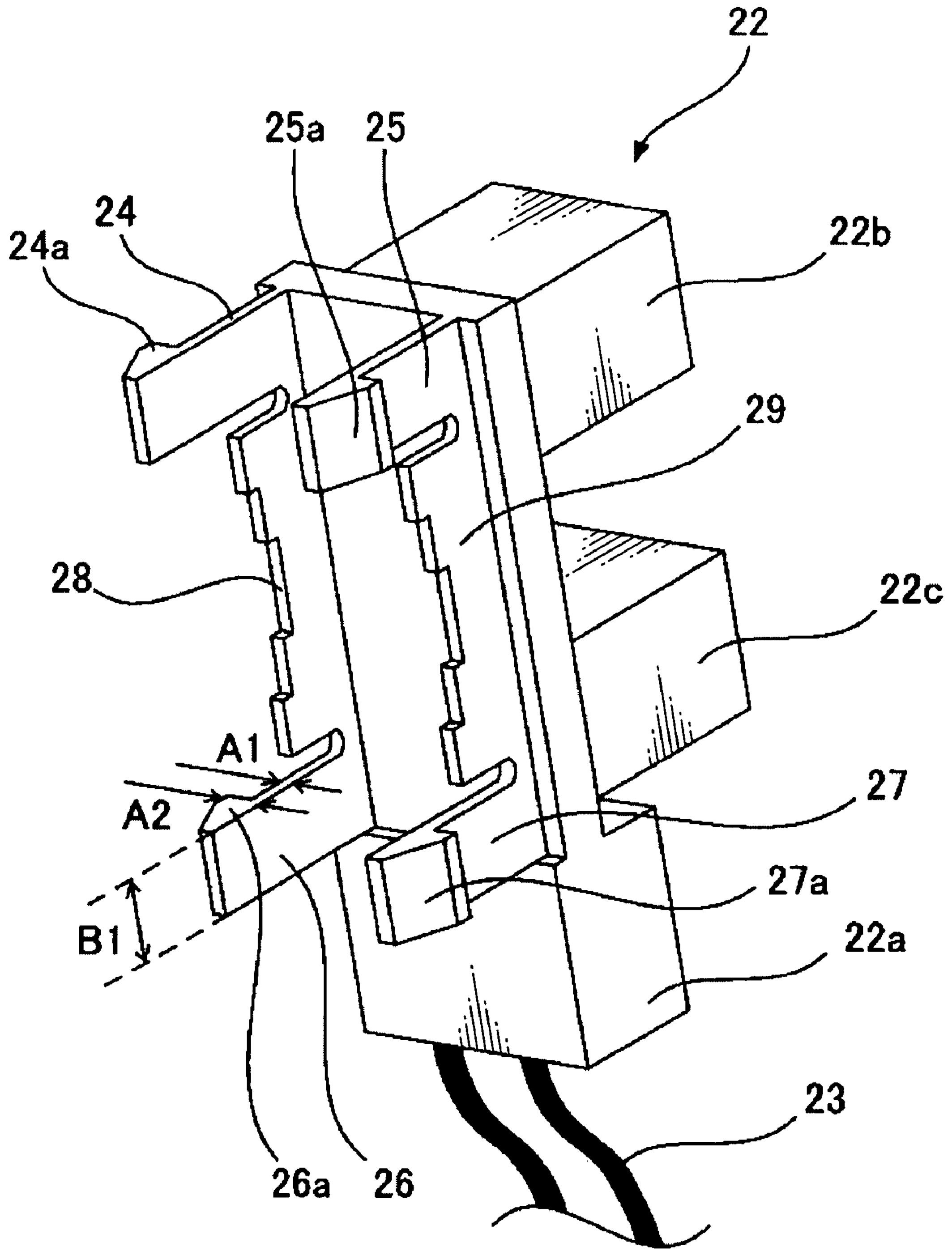
FIG. 4 is a perspective view of the photosensor when viewed from underside.

The photosensor 22 corresponds to an electronic component according to the present invention, and is a transmissive photointerrupter in this embodiment. Specifically, the photosensor 22 integrally includes a base portion 22*a* extending in vertical direction, a light emitting portion 22*b* and a light receiving portion 22*c* as shown in FIG. 4. The base portion 22*a* has a rear surface and a front surface opposite to the rear surface. The light emitting portion 22*b* and light receiving portion 22*c* project toward the same side from the front surface of the base portion 22*a* and are vertically arranged one above the other, and light is emitted from the light emitting portion 22*b* to the light receiving portion 22*c*. Wires 23 are connected with the bottom end of the base portion 22*a* to electrically connect the photosensor 22 with an unillustrated controller.

In this embodiment, the longitudinal direction (vertical direction in the posture shown in FIG. 4) of the base portion 22*a* corresponds to a second direction according to the present invention.

The photosensor 22 is so arranged as to be turned on and off by the actuation of the actuator 21 associated with the discharge of a sheet. Specifically, when no sheet is discharged from the discharge port 15, the light blocking portion 21*c* of the actuator 21 blocks the light emitted from the light emitting portion 22*b* to the light receiving portion 22*c*. On the other hand, when a sheet is discharged from the discharge port 15, this sheet pushes the sheet detecting portion 21*b* up to rotate the shaft 21*a*, whereby the light blocking portion 21*c* rotating together with the shaft 21*a* moves away from a light path of the photosensor 22 to permit the light incidence on the light receiving portion 22*c* from the light emitting portion 22*b*. Thus, the photosensor 22 can detect the passage of the sheet. When the discharge of the sheet is completed, the actuator 21 returns to its initial position by the action of its own weight and the light blocking portion 21*c* blocks the light path of the photosensor 22.

The detector and the controller detect the presence or absence of abnormality in a sheet discharging state based on a time during which the light receiving portion 22*c* receives the light from the light emitting portion 22*b*. Specifically, the controller stores the time during which the light receiving portion 22*c* of the photosensor 22 receives the light emitting portion 22*b* as a set time when a sheet used for image formation is normally discharged, and makes judgments as to whether or not there is any sheet remaining at the discharge port 15, i.e. whether the sheet being discharged is jammed or the sheets stacked on the discharge tray 16 are overflowing when an actual light receiving time exceeds this set time. The set time is calculated based on the length of the sheet in a sheet conveying direction and a sheet conveying speed during the image forming operation.

Figure 5:
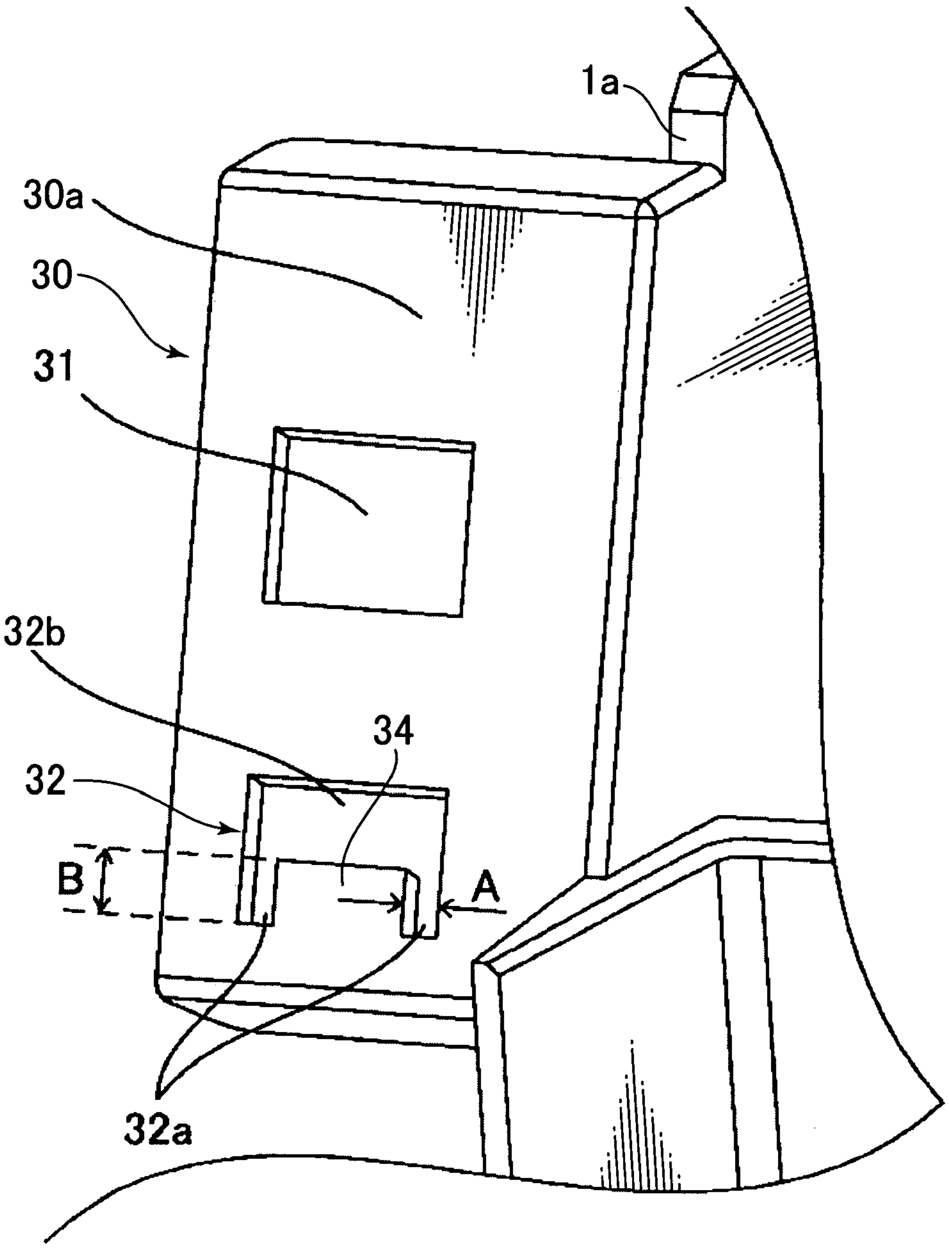
FIG. 5 is a perspective view of an attachment portion, to which the photosensor is attached, when viewed from topside.

The photosensor 22 is attached to an attachment portion 30 provided at the outer side surface of the side wall 1*a*. A structure for this attachment is described with reference to FIGS. 4 and 5. FIG. 4 is a perspective view of the photosensor 22 when viewed from underside, and FIG. 5 is a perspective view of the attachment portion, to which the photosensor 22 is attached, when viewed from topside.

A pair of left and right second locking pieces 24, 25, a pair of left and right first locking pieces 26, 27 and a pair of left and right contact pieces 28, 29 are integrally formed with the base portion 22*a* on the rear surface of the base portion 22*a* of the photosensor 22, i.e. on the surface opposite to the one where the light emitting portion 22*b* and the light receiving portion 22*c* are formed. The second locking piece 24, the contact piece 28 and the first locking piece 26 on the left side are aligned in this order from the top and are integrally united into a plate member extending in vertical direction. Similarly, the second locking piece 25, the contact piece 29 and the first locking piece 27 on the right side are aligned in this order from the top and are integrally united into a plate member extending in vertical direction. In other words, the respective contact pieces 28, 29 serve as coupling portions for coupling the corresponding first and second locking pieces.

The second locking pieces 24, 25 project from the upper end of the rear surface of the base portion 22*a* and are opposed to each other in a transverse direction, i.e. in the width direction of the base portion 22*a*. In this embodiment, this transverse direction corresponds to a first direction according to the present invention. Second locking claws 24*a*, 25*a* projecting outward in the transverse direction are integrally formed at the ends of the respective second locking pieces 24, 25. Each of the second locking claws 24*a*, 25*a* has such a tapered shape as to gradually reduce its projecting distance toward the leading end of the second locking piece so as to facilitate the insertion of the second locking pieces 24, 25 into a second locking hole 31 formed in the attachment portion 30 as described later.

The first locking pieces 26, 27 are formed at positions spaced downward a specified distance from the second locking pieces 24, 25, project from the rear surface of the base portion 22*a* and are opposed to each other in the transverse direction similar to the second locking pieces 24, 25. These first locking pieces 26, 27 have a common thickness A1 and a common width (vertical dimension) B1. First locking claws 26*a*, 27*a* projecting outward in the transverse direction are also formed at the ends of the respective first locking pieces 26, 27. Each of the first locking claws 26*a*, 27*a* has such a tapered shape as to gradually reduce its projecting distance toward the leading end of the first locking piece so as to facilitate the insertion of the first locking pieces 26, 27 into a first locking hole 32 formed in the attachment portion 30 as described later. The rear ends of the first locking claws 26*a*, 27*a* has a maximum width A2.

The contact piece 28 is formed between the second locking piece 24 and the first locking piece 26 to integrally connect base parts of the both locking pieces 24, 26. Similarly, the contact piece 29 is formed between the second locking piece 25 and the first locking piece 27 to integrally connect base parts of the both locking pieces 25, 27. The contact pieces 28, 29 are opposed to each other in the first direction, i.e. in the width direction of the base portion 22*a*. A distance from the leading ends of the contact pieces 28, 29 to the rear ends of the second locking claws 24*a*, 25*a* and the first locking claws 26*a*, 27*a* (i.e. ends where thickness is largest) is substantially equal to the thickness of the attachment portion 30. This distance enables the attachment portion 30 to be tightly held in the thickness direction thereof between the rear ends of the second locking claws 24*a*, 25*a* and the first locking claws 26*a*, 27*a* and the leading ends of the contact pieces 28, 29.

The attachment portion 30 is in the form of a plate projecting outward from the side wall 1*a* and extending in vertical direction. The photosensor 22 is attached to an attachment surface 30*a* that is the front surface of the attachment portion 30.

The attachment portion 30 is formed with the second locking hole 31 and the first locking hole 32 penetrating the attachment portion 30 in thickness direction as shown in FIG. 5.

The second locking pieces 24, 25 are insertable into the second locking hole 31 in a projecting direction thereof. The second locking hole 31 is rectangular, and has a width substantially equal to a spacing between the outer surfaces of parts (base parts) of the second locking pieces 24, 25 where the second locking claws 24*a*, 25*a* are not formed, and a height slightly larger than the width of the second locking pieces 24, 25 (dimension in the vertical direction, i.e. in the second direction).

The first locking hole 32 is comprised of an insertion portion 32*b* into which the first locking pieces 26, 27 are insertable in a projecting direction thereof, and a pair of left and right locking portions 32*a* adjacent to the insertion portion 32*b* at a side (lower side in FIG. 5) opposite to the second locking hole 31.

The insertion portion 32*b* is rectangular similar to the second locking hole 31. This rectangular shape has a width substantially equal to a spacing between the outer surfaces of parts (base parts) of the first locking pieces 26, 27 where the first locking claws 26*a*, 27*a* are not formed, and a height slightly larger than the width of the first locking pieces 26, 27 (dimension in the vertical direction, i.e. in the second direction). This shape permits the first locking pieces 26, 27 to be elastically displaced inward so as to enable the passage of the first locking claws 26*a*, 27*a* through the insertion portion 32*b*.

The both locking portions 32*a* extend downward from the opposite left and right ends of the insertion portion 32*b*. The respective locking portions 32*a* have a width A larger than the thickness A1 of the first locking pieces 26, 27 and smaller than a thickness (largest thickness) A2 of the rear ends of the first locking claws 26*a*, 27*a*, and a depth B (dimension in the vertical direction) that is larger than half the width B1 of the first locking pieces 26, 27. The second and first locking holes 31, 32 are distanced from each other so that a distance from the upper end of the second locking hole 31 to the bottom ends of the both locking portions 32*a* is substantially equal to a distance from the upper ends of the second locking pieces 24, 25 to the bottom ends of the first locking pieces 26, 27.

A rectangular deformation restricting portion 34 is present between the locking portions 32*a*. This deformation restricting portion 34 restricts inward elastic deformations of the first locking pieces 26, 27 entering the respective locking portions 32*a*.

Figure 6:
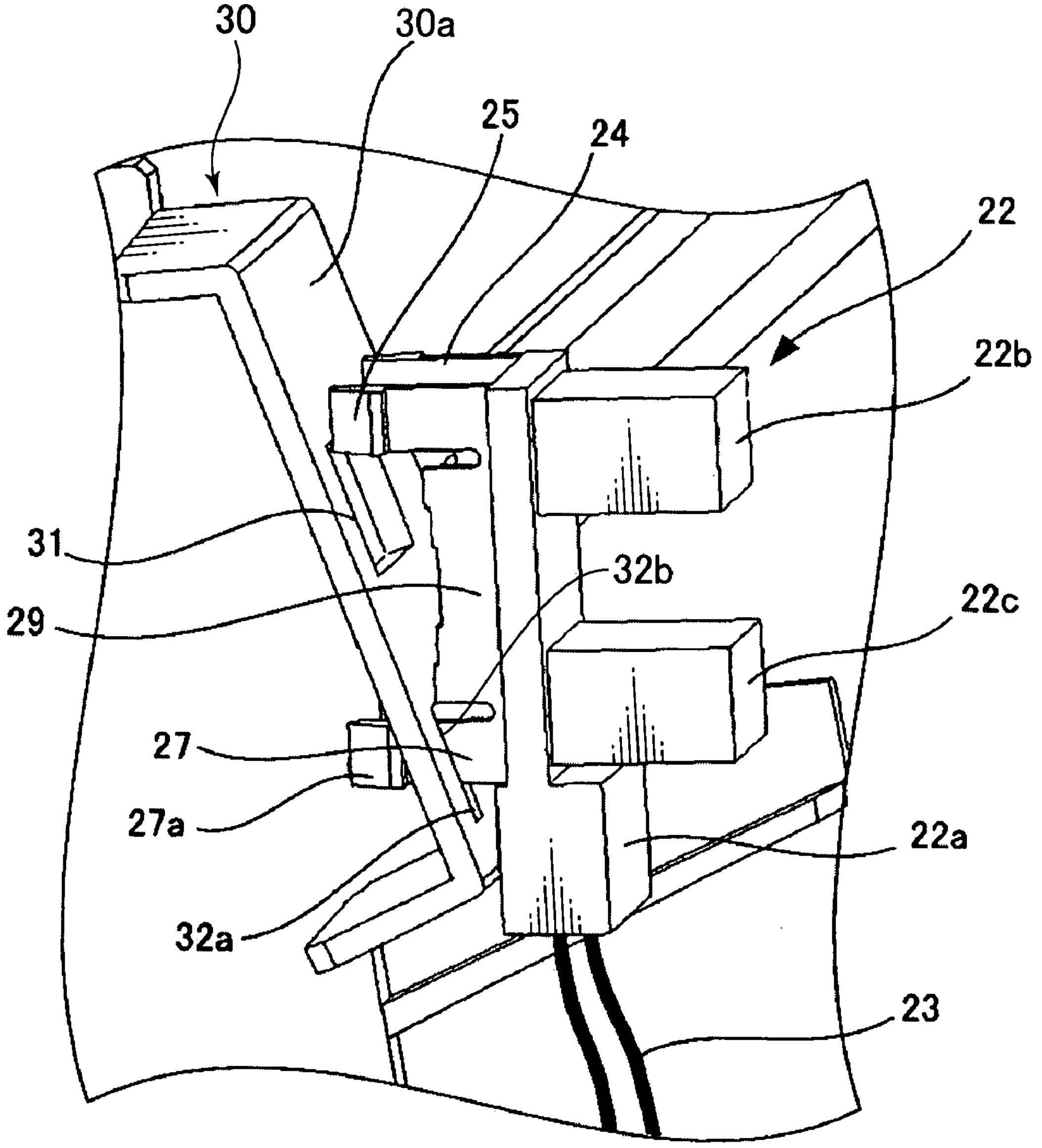
FIG. 6 is a perspective view showing an intermediate state of an operation of attaching the photosensor where first locking pieces are inserted in a first locking hole.

Next, the process of attaching the photosensor 22 to the attachment portion 30 is described with reference to FIGS. 6 to 8. FIG. 6 is a perspective view showing a state where the first locking pieces 26, 27 are inserted in the first locking hole 32 during an operation of attaching the photosensor 22, FIG. 7 is a perspective view showing a state where the first locking pieces 26, 27 are inserted in the locking portions 32*a* during the attaching operation, and FIG. 8 is a perspective view of the attached photosensor 22 when viewed from the underside of the attachment portion 30.

In order to attach the photosensor 22 to the attachment portion 30, the first locking pieces 26, 27 are first inserted into the insertion portion 32*b* of the first locking hole 32 while the photosensor 22 is inclined with respect to the attachment portion 30 as shown in FIG. 6. The first locking pieces 26, 27 are temporarily elastically deformed inward along the width direction of the base portion 22*a* during this insertion. When the first locking claws 26*a*, 27*a* completely pass the first locking hole 32, the first locking pieces 26, 27 return to their initial positions by their own elastic restoring forces, whereby the first locking claws 26*a*, 27*a* are engaged with peripheral edges of the first locking hole 32.

Figure 7:
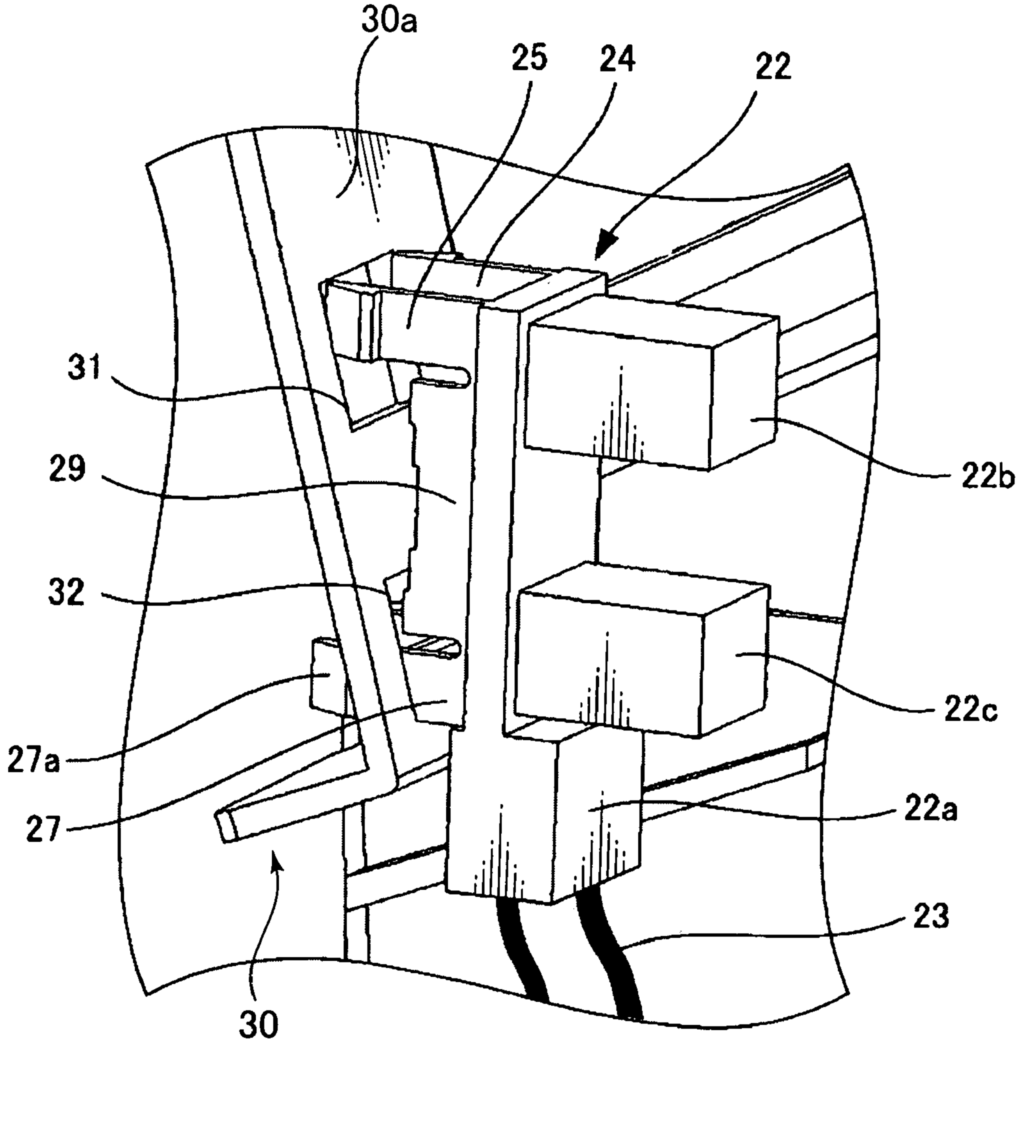
FIG. 7 is a perspective view showing an intermediate state of the operation of attaching the photosensor where the first locking pieces are inserted in locking portions.
Figure 8:
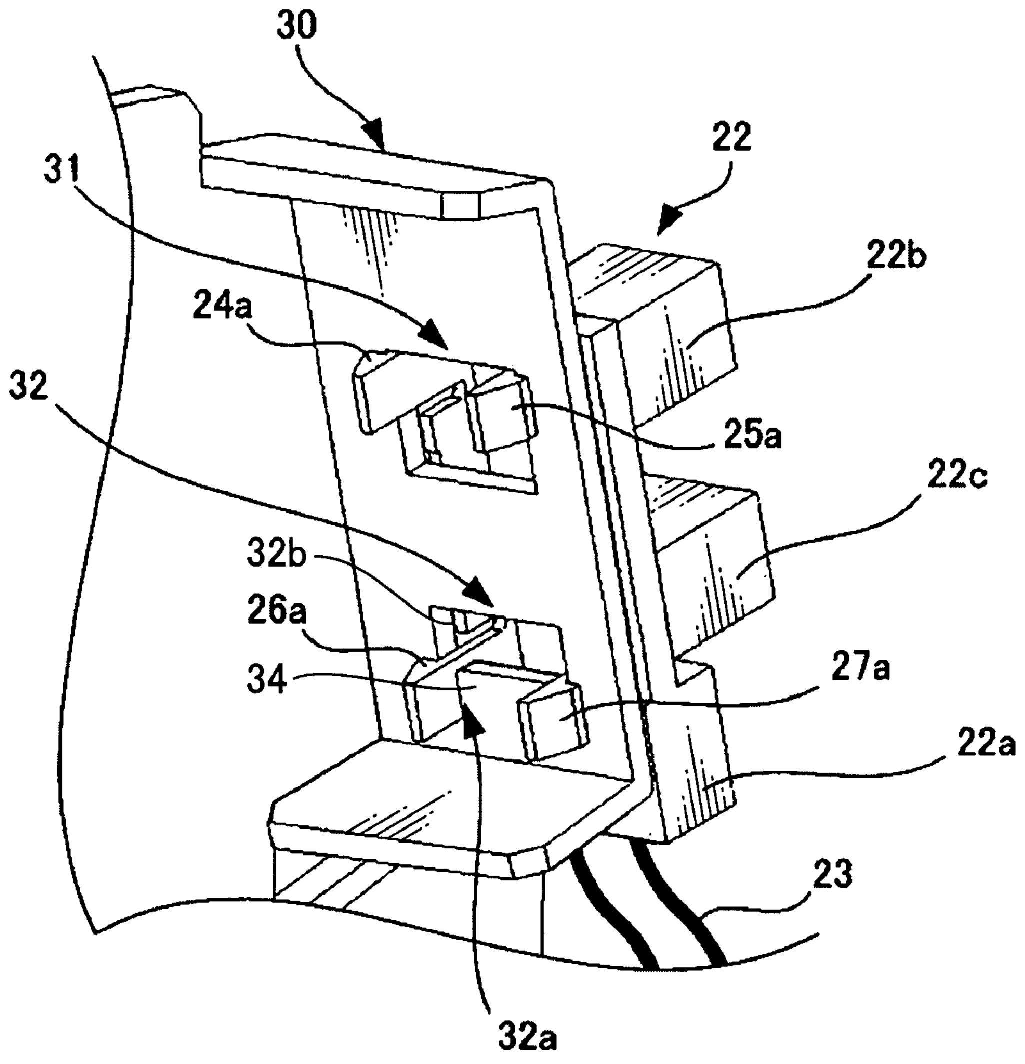
FIG. 8 is a perspective view of the attached photosensor when viewed from the underside of the attachment portion.

In this engaged state, the photosensor 22 is operated to slide downward as shown in FIG. 7. By this operation, the first locking pieces 26, 27 enter the corresponding locking portions 32*a* extending downward from the opposite lateral ends of the insertion portion 32*b* while being inserted in the first locking hole 32. As the first locking pieces 26, 27 enter, the deformation restricting portion 34 comes to be located between the first locking pieces 26, 27 as shown in FIG. 8, thereby hindering inward elastic deformations (elastic displacements) of these first locking pieces 26, 27. This hindrance assuredly keep the engagement between the first locking claws 26*a*, 27*a* and the attachment portion 30. Since the width A of the locking portions 32*a* is smaller than the thickness (maximum thickness) A2 of the rear ends of the first locking claws 26*a*, 27*a*, there is no likelihood of disengaging the first locking pieces 26, 27 from the attachment portion 30 unless the photosensor 22 slides upward so that the first locking pieces 26, 27 come out of the locking portions 32*a*.

After the photosensor 22 is slid downward in this way, the second locking pieces 24, 25 are inserted into the second locking hole 31. The second locking pieces 24, 25 are respectively elastically deformed inward along the width direction of the base portion 22*a* during this insertion. However, when the second locking claws 24*a*, 25*a* completely pass the second locking hole 31, the second locking pieces 24, 25 return to their initial positions due to their own elastic restoring forces, whereby the second locking claws 24*a*, 25*a* are engaged with peripheral edges of the second locking hole 31.

By the above operation, the photosensor 22 is fixed to the attachment portion 30 by the second locking claws 24*a*, 25*a* and the first locking claws 26*a*, 27*a* thereof as shown in FIG. 8.

Since the distance from the upper end of the second locking hole 31 to the bottom ends of the locking portions 32*a* is substantially equal to the distance from the upper ends of the second locking pieces 24, 25 to the bottom ends of the first locking pieces 26, 27 as described above, the second locking pieces 24, 25 come into contact with the upper edge of the second locking hole 31 from below (i.e. in a direction away from the first locking hole 32) to restrict an upward sliding movement of the photosensor 22 when being inserted into the second locking hole 31. This restriction prevents the first locking pieces 26, 27 from coming out of the locking portions 32*a*, whereby assuredly preventing the first locking pieces 26, 27 from coming out of the first locking hole 32.

Further, since the wires 23 connecting the photosensor 22 and the controller are connected with the bottom end of the photosensor 22, the photosensor 22 is not disengaged from the attachment portion 30 even if these wires 23 are pulled.

Specifically, forces pulling the wires 23 are transmitted as downward acting forces to the photosensor 22, whereas the first locking pieces 26, 27 of this photosensor 22 do not come out of the first locking hole 32 unless coming upward out of the locking portions 32*a*. Thus, the disengagement of the photosensor 22 from the attachment portion 30 resulting from the pulling of the wires 23 connected with the photosensor 22 can be reliably prevented.

It should be noted that the present invention is not limited to this embodiment and various changes can be made without departing from the scope and spirit of the present invention.

Figure 9:
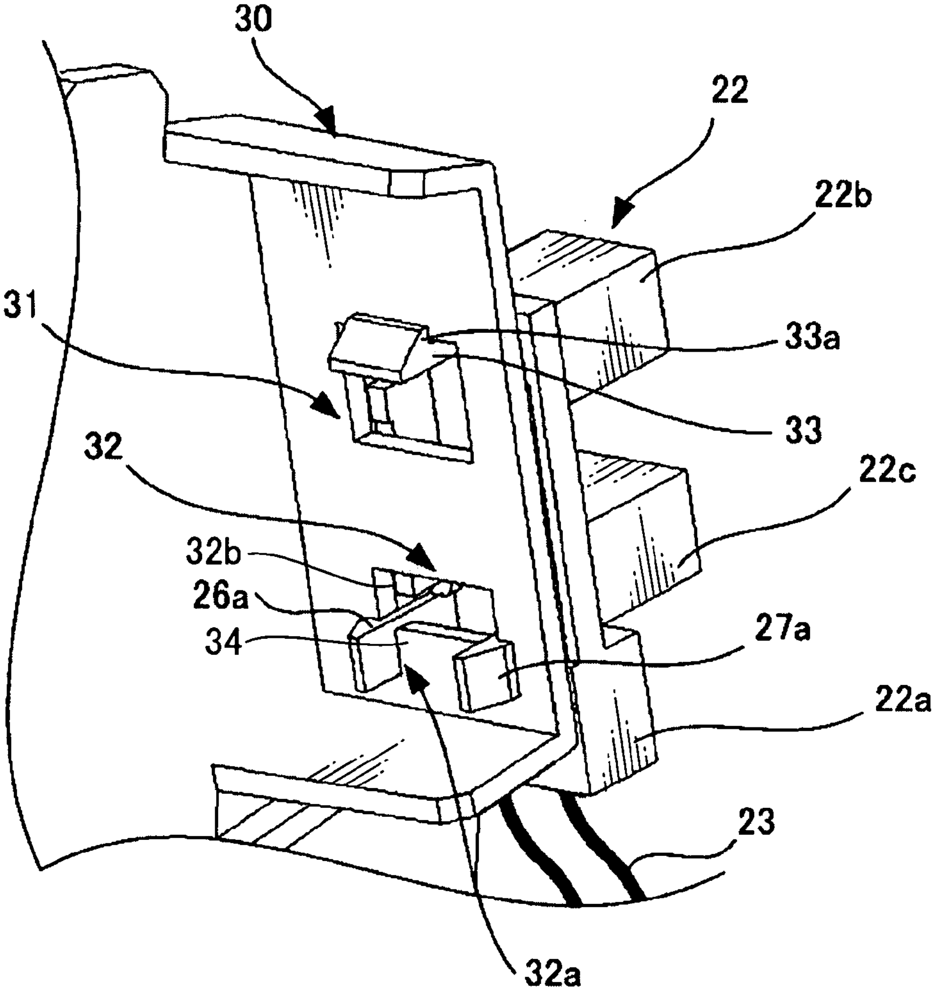
FIG. 9 is a perspective view showing a photosensor attaching structure according to another embodiment of the invention.
Figure 10:
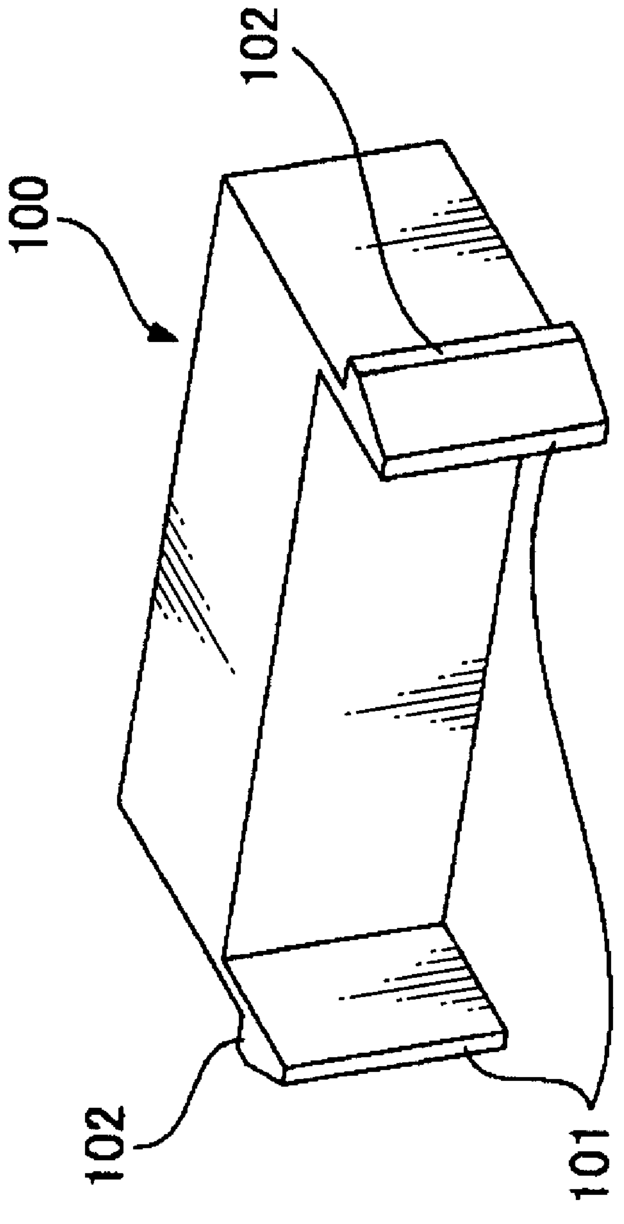
FIG. 10 is a perspective view showing a conventional electronic component.
Figure 11:
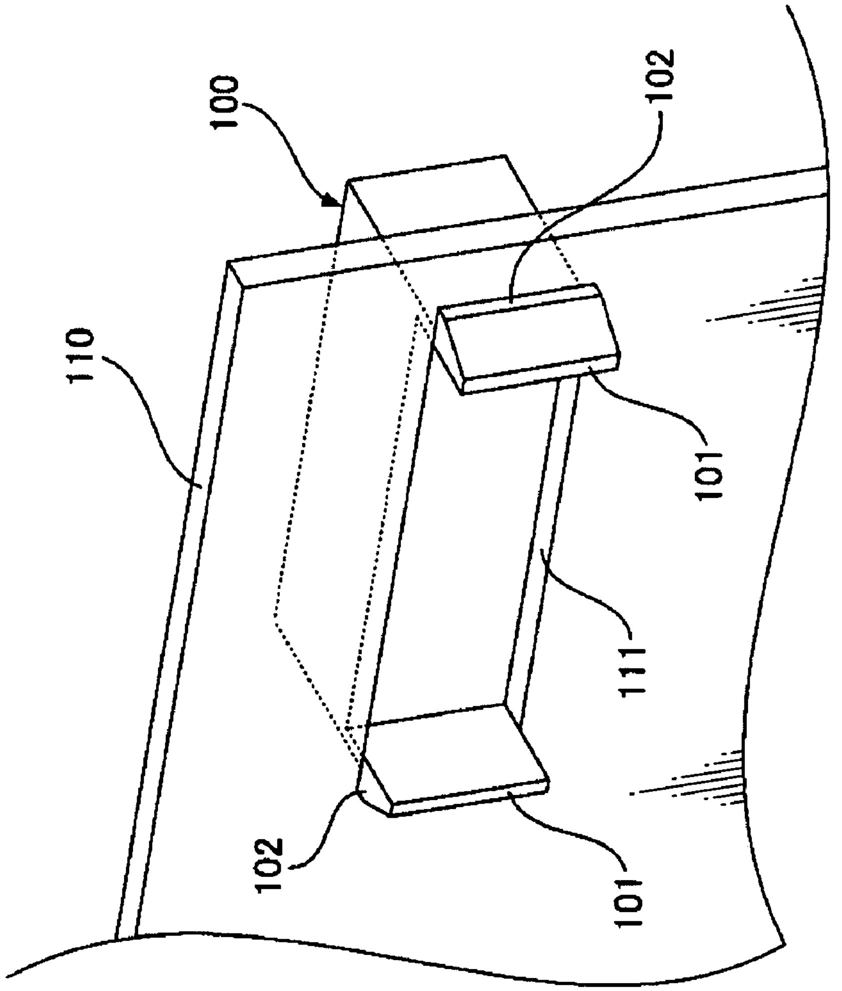
FIG. 11 is a perspective view showing a conventional electronic component attaching structure.

For example, the locking piece for preventing an upward sliding movement of the photosensor 22 is not limited to the second locking pieces 24, 25 opposed to each other in the transverse direction as described above, and may be a single second locking piece 33 as shown in FIG. 9. This second locking piece 33 extends in the width direction of the base portion 22*a* along the upper end edge of the base portion 22*a*, and has a leading end elastically deformable upward and downward. The leading end of the second locking piece 33*a* is formed with locking claw 33*a* projecting upward, i.e. outward along a direction of longer sides of the base portion 22*a*.

This locking claw 33*a* can pass the second locking hole 31, accompanied by a downward elastic displacement of the second locking piece 33. After this passage, the second locking piece 33 is elastically restored to engage the attachment portion 30. The second locking piece 33 comes in contact with the upper edge of the second locking hole 31 to hinder an upward sliding movement of the photosensor 22.

In this structure, a distance from the upper end of a part of the second locking piece 33 where the locking claw 33*a* is not formed to the bottom ends of the first locking pieces 26, 27 has to be substantially equal to the distance from the upper end of the second locking hole 31 to the bottom ends of the locking portions 32*a*. Further, a distance from the upper end of a part of the second locking piece 33 where the locking claw 33*a* projects most to the bottom ends of the first locking pieces 26, 27 has to be longer than the distance from the upper end of the second locking hole 31 to the bottom ends of the locking portions 32*a*.

The first locking claws 26*a*, 27*a* formed at the leading ends of the first locking pieces 26, 27 may project inward. In this case, the thickness of parts of the first locking pieces 26, 27 where the first locking claws 26*a*, 27*a* project most has to be larger than the width of the locking portions 32*a*, so as to prevent the first locking claws 26*a*, 27*a* from passing through the locking portions 32*a* when the respective first locking pieces 26, 27 enter the corresponding locking portions 32*a*. Further, in this case, the first locking pieces 26, 27 is not required to be elastically deformable.

The first locking hole 32 and the second locking hole 31 may communicate with each other to constitute a single hole so that a distance from the leading ends of the locking portions 32*a* to the upper end of the first locking hole 32 may be substantially equal to a distance from the bottom ends of the first locking pieces 26, 27 to the upper ends of the second locking pieces 24, 25.

Conversely, the insertion portion 32*b* of the first locking hole 32 may not be a single hole commonly used by the both first and second locking pieces 26, 27, and left and right insertion portions may be independently formed for the respective first locking pieces 26, 27 similar to the respective locking portions 32*a*.

As described above, the present invention is directed to an electronic component attaching structure comprising an electronic component and an attachment portion to which the electronic component is attached. In this structure, the electronic component has a rear surface and the attachment portion has an attachment surface facing the rear surface. The electronic component includes a pair of first locking pieces projecting from the rear surface and opposed to each other in a first direction parallel to the attachment surface, and a second locking piece projecting from the rear surface at a position distanced from the first locking pieces in a second direction parallel to the attachment surface and normal to the first direction. The attachment portion is formed with a first locking hole which is a through hole and into which the both first locking pieces are insertable in a projecting direction thereof, and a second locking hole which is a through hole and into which the second locking piece is insertable in a projecting direction thereof, wherein the first locking hole includes an insertion portion for insertion of the both first locking pieces and locking portions neighboring the insertion portion at a side opposite to the second locking hole. The insertion portion is so shaped as to permit the insertion of the both first locking pieces thereinto, and the locking portions are so shaped that the first locking pieces can move into the locking portions from the insertion portion while being inserted in the insertion portion and the both first locking pieces are prevented from coming out of the locking portions. The second locking piece is so shaped as to be engaged with the attachment portion by being inserted into the second locking hole while the both first locking pieces are located in the locking portions of the first locking hole and prevents the first locking pieces from moving from the locking portions of the first locking hole toward the insertion portion by coming into contact with a peripheral edge of the second locking hole to.

In this structure, the first locking pieces of the attached electronic component can be reliably prevented from coming out of the first locking holes of the attachment portion. In other words, the first locking pieces are insertable into the insertion portion of the first locking hole, and cannot come out of the locking portions upon moving into the locking portions from the insertion portion after the insertion. Further, the second locking piece is engaged with the second locking hole and hinders the first locking pieces from moving from the locking portions to the insertion portion by coming into contact with the suitable peripheral edge of the second locking hole in this state. This hindrance reliably prevents the disengagement of the electronic component from the attachment portion.

A specific preferable mode of this structure is as follows. Each first locking piece has an elastically displaceable leading end; a first locking claw projecting outward is formed at the leading end of each first locking piece; the insertion portion of the first locking hole has a width equal to or larger than a space between the outer side surfaces of parts of the respective first locking pieces where the first locking claws are not formed and smaller than a spacing between most projecting parts of the both first locking claws and is so shaped as to permit inward elastic displacements of the both first locking pieces in order to enable the passage of the both first locking claws through the insertion portion; and the locking portions are so shaped as to enable the both first locking pieces to move into the locking portions from the insertion portion after the both first locking claws pass through the insertion portion and to restrict inward elastic displacements of the both first locking pieces in order to hinder the passage of the both first locking claws through the locking portions.

In this structure, although the outward projecting first locking claws are formed at the leading ends thereof, the first locking claws can pass through the insertion portion with the elastic deformation of the first locking pieces, and the first locking pieces are restored to engage the attachment portion after the passage. When the respective first locking pieces move into the pair of locking portions from the insertion portion, a deformation restricting portion present between the locking portions restricts inward elastic displacements of the first locking pieces, whereby the first locking pieces can be reliably prevented from coming out of the respective locking portions.

In such a case, the insertion portion of the first locking hole preferably has a rectangular shape having a width equal to or larger than the space between the outer side surfaces of the parts of the respective first locking pieces where the first locking claws are not formed and smaller than the spacing between the most projecting parts of the both first locking claws and having a height larger than a dimension of the first locking pieces in the second direction. This insertion portion permits the insertion of the first locking pieces having the first locking claws thereinto, although the insertion portion has a simple shape.

On the other hand, the locking portions of the first locking hole preferably extend from the opposite widthwise ends of the insertion portion of the first locking hole toward a side opposite to the second locking hole, and have a width enabling the entrance of the respective first locking pieces, and the attachment portion preferably has the deformation restricting portion present between the two locking portions for restricting inward elastic displacements of the respective first locking pieces. When the respective first locking pieces enter the corresponding locking portions, inward elastic displacements of these first locking pieces can be reliably restricted by the deformation restricting portion between the locking portions.

If the respective locking portions have, for example, a dimension equal to or larger than half the dimension of the first locking pieces in the second direction, the both first locking pieces can be prevented from coming out of the locking portions with high reliability.

A preferable mode of the second locking piece and the second locking hole is, for example, as follows. The second locking piece has an elastically displaceable leading end, and an outward projecting second locking claw is formed at the leading end of the second locking piece. The second locking hole is formed at such a position that the second locking claw can pass through the second locking hole, accompanied by an elastic displacement of the second locking piece with the both first locking pieces located in the locking portions of the first locking hole and that the second locking claw is engaged with the peripheral edge of the second locking hole after the passage.

Particularly, if the structure is such that the electronic component includes the second locking piece at each of a pair of positions arranged in the first direction, these second locking pieces are elastically displaceable inward along the first direction, the second locking claws project outward along the first direction at the leading ends of the respective second locking pieces, and the respective second locking pieces come into contact with the peripheral edge of the second locking hole in a direction away from the first locking hole along the second direction to hinder the both first locking pieces from moving into the insertion portion from the locking portions of the first locking hole, the second locking pieces can be stably engaged with the peripheral edge of the second locking hole.

In such a case, it is more preferable that the respective second locking pieces are formed at such positions as to be aligned with the corresponding first locking pieces, and that the electronic component includes a pair of connecting portions projecting a distance shorter than the projecting distances of the first and second locking pieces from the rear surface of the electronic component between the first and second locking pieces aligned in the second direction and connecting the first and second locking pieces. These connecting portions simultaneously and effectively reinforce the first and second locking pieces.

Further, if the connecting portions have such a projecting distance as to be held in contact with the attachment surface of the attachment portion with the first and second locking claws passed through the first and second locking holes, so that the attachment portion can be held between the first and second locking claws and the connecting portions, the connecting portions can have a function of more stabilizing the attached state of the electronic component.

The electronic component can be connected with another external circuit, for example, via a wire. In such a case, if the wire is connected with the electronic component at such a position that a pulling force acting on the wire is transmitted to the electronic component as a force acting in a direction to move the electronic component from the insertion portion of the first locking hole to the locking portions, the disengagement of the electronic component from the attachment portion resulting from the pulling of the wire can be more reliably prevented.

The present invention is applicable in attaching various electronic components. Particularly, if the electronic component is an optical sensor, this optical sensor preferably includes a base portion extending in the second direction and having a rear surface capable of facing the attachment surface and a front surface opposite to the rear surface, a light emitting element projecting from the front surface of the base portion to emit a light in the second direction, and a light receiving element projecting from the front surface of the base portion at a position aligned with the light emitting element in the second direction and adapted to receive the light emitted by the light emitting element, and the first and second locking pieces preferably project from the rear surface of the base portion.

In this optical sensor, sufficient distances can be ensured between the light emitting element and the light receiving element and between the first and second locking pieces, utilizing a dimension of the base portion in a longitudinal direction, i.e. the second direction.

The above structure is suitably applicable to an image forming apparatus, for example, for forming an image on a sheet.

This application is based on patent application No. 2006-133853 filed in Japan, the contents of which are hereby incorporated by references.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds are therefore intended to embraced by the claims.

What is claimed is:

1. An electronic component attaching structure, comprising an electronic component and an attachment portion to which the electronic component is attached, wherein:

the electronic component has a rear surface and the attachment portion has an attachment surface facing the rear surface;

the electronic component includes a pair of first locking pieces projecting from the rear surface and opposed to each other in a first direction parallel to the attachment surface, and a second locking piece projecting from the rear surface at a position distanced from the first locking pieces in a second direction parallel to the attachment surface and normal to the first direction;

the attachment portion is formed with a first locking hole which is a through hole and into which the both first locking pieces are insertable in a projecting direction thereof, and a second locking hole which is a through hole and into which the second locking piece is insertable in a projecting direction thereof, the first locking hole including an insertion portion for the insertion of the both first locking pieces and locking portions neighboring the insertion portion at a side opposite to the second locking hole;

the insertion portion is so shaped as to permit the insertion of the both first locking pieces thereinto, and the locking portions are so shaped that the first locking pieces can move into the locking portions from the insertion portion while being inserted in the insertion portion and the both first locking pieces are prevented from coming out of the locking portions; and the second locking piece is so shaped as to be engaged with the attachment portion by being inserted into the second locking hole while the both first locking pieces are located in the locking portions of the first locking hole and prevents the first locking pieces from moving from the locking portions of the first locking hole toward the insertion portion by coming into contact with a peripheral edge of the second locking hole.

2. An electronic component attaching structure according to claim 1, wherein:

each first locking piece has an elastically displaceable leading end and a first locking claw projecting outward is formed at the leading end of each first locking piece;

the insertion portion of the first locking hole has a width equal to or larger than a space between the outer side surfaces of parts of the respective first locking pieces where the first locking claws are not formed and smaller than a space between most projecting parts of the both first locking claws and is so shaped as to permit inward elastic displacements of the both first locking pieces in order to enable the passage of the both first locking claws through the insertion portion; and the locking portions are so shaped as to enable the both first locking pieces to move into the locking portions from the insertion portion after the both first locking claws pass through the insertion portion and to restrict inward elastic displacements of the both first locking pieces in order to hinder the passage of the both first locking claws through the locking portions.

3. An electronic component attaching structure according to claim 2, wherein the insertion portion of the first locking hole has a rectangular shape having a width equal to or larger than the space between the outer side surfaces of the parts of the respective first locking pieces where the first locking claws are not formed and smaller than the spacing between the most projecting parts of the both first locking claws and having a height larger than a dimension of the first locking pieces in the second direction.

4. An electronic component attaching structure according to claim 2, wherein:

the locking portions of the first locking hole extend from the opposite widthwise ends of the insertion portion of the first locking hole toward a side opposite to the second locking hole, and have a width enabling the entrance of the respective first locking pieces; and the attachment portion has a deformation restricting portion present between the two locking portions for restricting inward elastic displacements of the respective first locking pieces.

5. An electronic component attaching structure according to claim 4, wherein the respective locking portions have a dimension equal to or larger than half the dimension of the first locking pieces in the second direction.

6. An electronic component attaching structure according to claim 1, wherein:

the second locking piece has an elastically displaceable leading end and an outward projecting second locking claw is formed at the leading end of the second locking piece; and the second locking hole is formed at such a position that the second locking claw can pass through the second locking hole, accompanied by an elastic displacement of the second locking piece with the both first locking pieces located in the locking portions of the first locking hole and that the second locking claw is engaged with peripheral edges of the second locking hole after the passage.

7. An electronic component attaching structure according to claim 6, wherein:

the electronic component includes the second locking piece at each of a pair of positions arranged in the first direction;

the second locking pieces are elastically displaceable inward along the first direction;

the second locking claws project outward along the first direction at the leading ends of the respective second locking pieces; and the respective second locking pieces come into contact with the peripheral edge of the second locking hole in a direction away from the first locking hole along the second direction to hinder the both first locking pieces from moving into the insertion portion from the locking portions of the first locking hole.

8. An electronic component attaching structure according to claim 7, wherein:

the respective second locking pieces are formed at such positions as to be aligned with the corresponding first locking pieces; and the electronic component includes a pair of connecting portions projecting a distance shorter than the projecting distances of the first and second locking pieces from the rear surface of the electronic component between the first and second locking pieces aligned in the second direction and connecting the first and second locking pieces.

9. An electronic component attaching structure according to claim 8, wherein the connecting portions have such a projecting distance as to be held in contact with the attachment surface of the attachment portion with the first and second locking claws passed through the first and second locking holes, so that the attachment portion can be held between the first and second locking claws and the connecting portions.

10. An electronic component attaching structure according to claim 1, further comprising a wire for connecting the electronic component with another external circuit, wherein the wire is connected with the electronic component at such a position that a pulling force acting on the wire is transmitted to the electronic component as a force acting in a direction to move the electronic component from the insertion portion of the first locking hole to the locking portions.

11. An electronic component attaching structure according to claim 1, wherein:

the electronic component is an optical sensor; and the optical sensor includes a base portion extending in the second direction and having a rear surface capable of facing the attachment surface and a front surface opposite to the rear surface, a light emitting element projecting from the front surface of the base portion to emit a light in the second direction, and a light receiving element projecting from the front surface of the base portion at a position aligned with the light emitting element in the second direction, the first and second locking pieces projecting from the rear surface of the base portion.

12. An image forming apparatus for forming an image on a sheet, comprising the electronic component attaching structure according to claim 1.

* * * * *